Figure 1:
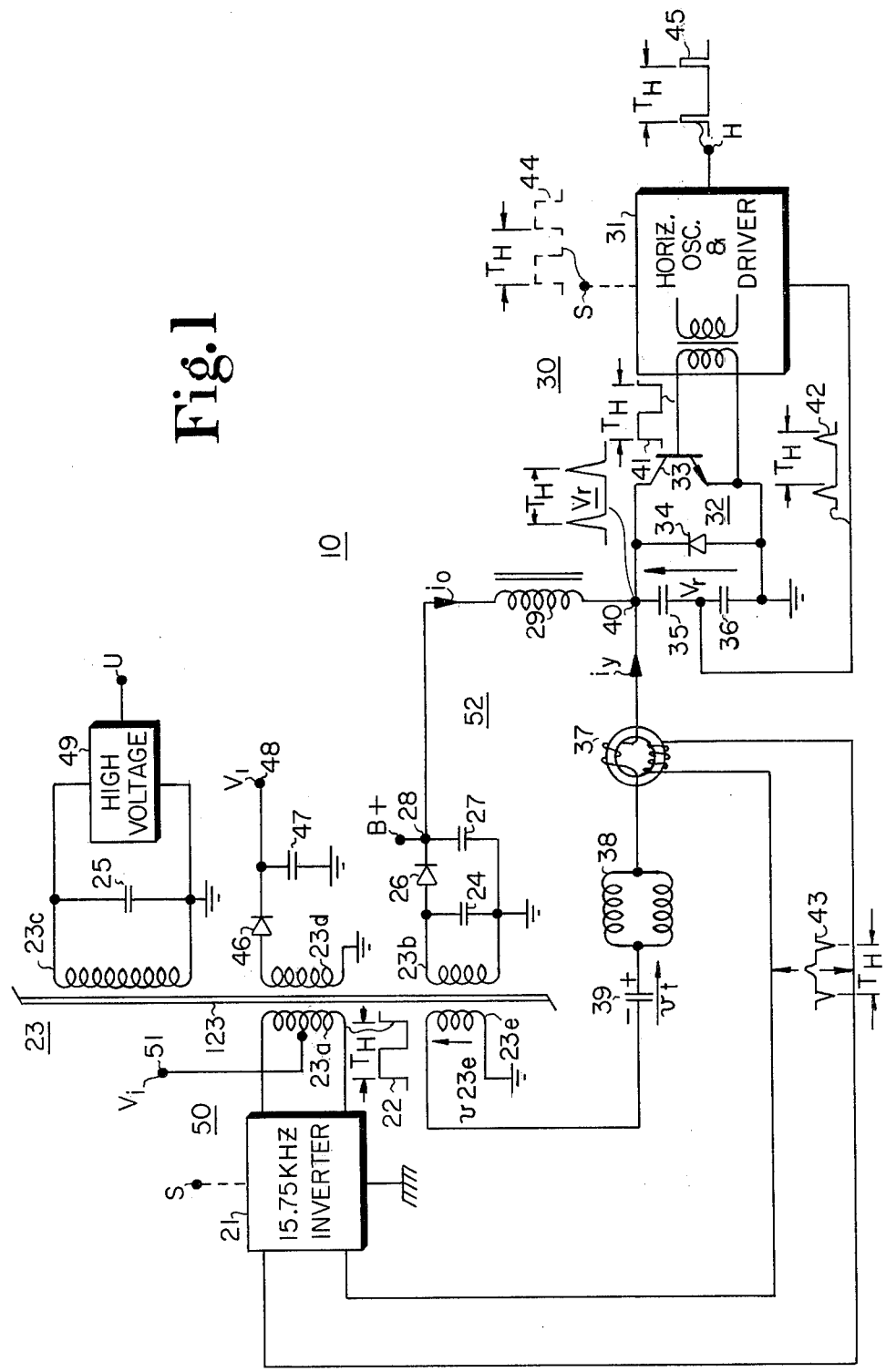

United States Patent [19]

Willis

[11] 4,321,511
[45] Mar. 23, 1982

[54] LINEARITY CORRECTED DEFLECTION CIRCUIT

[75] Inventor: Donald H. Willis, Indianapolis, Ind.

[73] Assignee: RCA Corporation, New York, N.Y.

[21] Appl. No.: 174,864

[22] Filed: Aug. 4, 1980

[51] Int. Cl.³ ..................... H01J 29/70; H01J 29/72
[52] U.S. Cl. .................................... 315/387; 315/371
[58] Field of Search ............... 315/370, 371, 387, 389

[56] References Cited

U.S. PATENT DOCUMENTS

| 3,192,433 | 6/1965 | Schneider . |
| 3,434,001 | 3/1969 | Okuda . |
| 3,796,911 | 3/1974 | Ensor et al. |
| 3,891,800 | 6/1975 | Janssen et al. |
| 4,024,432 | 5/1977 | Boekhorst . |

FOREIGN PATENT DOCUMENTS

| 736005 | 8/1955 | United Kingdom . |
| 780665 | 8/1957 | United Kingdom . |
| 867281 | 5/1961 | United Kingdom . |
| 1386231 | 3/1975 | United Kingdom . |
| 2044029 | 10/1980 | United Kingdom . |

Primary Examiner—Theodore M. Blum
Attorney, Agent, or Firm—Paul J. Rasmussen; William H. Meagher; Joseph Laks

[57] ABSTRACT

An inverter coupled to a source of DC input voltage is operated at the horizontal deflection frequency for developing a horizontal rate square-wave supply voltage. A power transformer having a first winding excited by the square-wave supply voltage develops a horizontal rate alternating polarity output voltage across second and third windings. A horizontal deflection generator is coupled to the second winding and is energized thereby to develop a trace voltage across a race capacitor. The deflection generator includes a trace switch coupled across the series arrangement of a horizontal deflection winding, the trace capacitor and the power transformer third winding. The trace switch is operated at a horizontal rate to generate horizontal deflection or scanning current in the deflection winding. A phase control circuit phases the alternating polarity output voltage relative to the phasing of the horizontal scanning current so as to apply a greater magnitude voltage across the horizontal deflection winding during the last half of the trace interval of each deflection cycle than during the first half of the trace interval. In this manner, linearity correction of the horizontal scanning current is obtained.

19 Claims, 2 Drawing Figures

LINEARITY CORRECTED DEFLECTION CIRCUIT

This invention relates to linearity correction for deflection circuits.

In a typical horizontal deflection circuit of a television receiver, the trace switch of the horizontal deflection generator applies a trace voltage developed across a trace capacitor to the horizontal deflection winding to generate an S-shaped horizontal deflection or scanning current. If dissipative losses in the horizontal deflection winding and generator were absent, the S-shaped scanning current would be a relatively symmetrical waveform. Due to dissipative losses in such elements as the trace switch and horizontal deflection winding, the scanning current waveform becomes asymmetrical, having a shallower slope than the ideal towards the end of the trace interval. Linearity distortion of the displayed raster is introduced, with the second half of each raster line being compressed relative to the first half.

To provide linearity correction of the scanning current waveform, conventional horizontal deflection circuits include a variable impedance in series with the trace capacitor and deflection winding. To provide linearity correction, the impedance of the linearity correction element is controlled so that the horizontal deflection current flowing in the impedance element encounters a smaller impedance during the second half of trace than during the first half of trace. Such a controllable impedance may comprise, for example, a saturable reactor winding having a core appropriately biased by a permanent magnet.

For television receiver picture tubes requiring large angle deflection, such as 100° or 110° deflection, it may be difficult to design a relatively compact and inexpensive saturable reactor which provides the required linearity correction. Furthermore, since the average impedance of the saturable reactor for large angle deflection may comprise a substantial fraction of the impedance of the horizontal deflection winding, the reactor must be designed to withstand the stress imposed by a relatively large retrace pulse voltage developed across the reactor winding.

A feature of the invention is to provide linearity correction to horizontal scanning current without using a controllable impedance. A source of alternating polarity voltage repeating at the horizontal deflection frequency is placed in series with the source of trace voltage and the horizontal deflection winding. Thus, when the trace switch is made conductive during the trace interval of each horizontal deflection cycle, the voltage applied across the horizontal deflection winding is the sum of the trace voltage and the horizontal rate alternating polarity voltage. A phasing circuit controls the phase of the horizontal alternating polarity voltage such that linearity correction of the horizontal deflection current is obtained. The phasing is such that the sum of the trace voltage and alternating polarity voltage during the latter portion of the trace interval is greater in magnitude than the same sum during the former portion, thereby steepening the slope of the scanning current waveform during the latter portion of trace from what it otherwise would be.

In a specific embodiment, the source of horizontal rate alternating polarity voltage comprises a square-wave generator operated at the horizontal deflection frequency and a power transformer having a primary winding excited by the output of the square-wave generator. An output winding of the power transformer is coupled in series with the deflection winding across the trace switch. The output of the square-wave generator is phased relative to the horizontal scanning current so that a zero-crossover instant of the square-wave output voltage occurs around the zero-crossover instant of the horizontal scanning current, thereby providing the correct phasing to obtain linearity correction of the horizontal scanning current.

Another feature of the invention is that the phasing of the square-wave voltage developed across the power transformer output winding is such that it is essentially in phase with the horizontal scanning current flowing in the output winding during the second half of the trace interval as well as the first half of the trace interval, thereby providing a net power flow into the horizontal deflection generator during substantially all of the trace interval.

Figure 2:
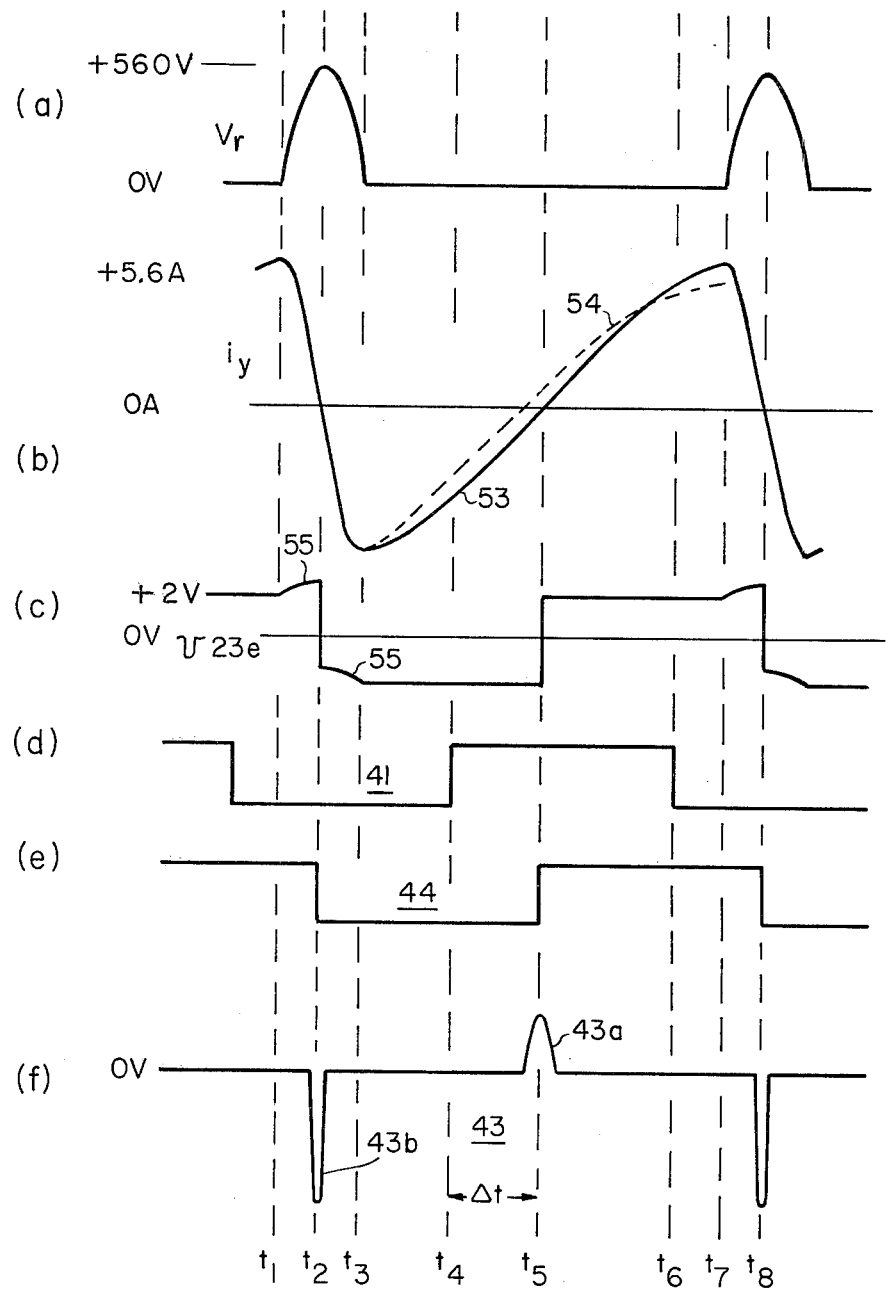

FIG. 1 illustrates a power supply and deflection circuit with linearity correction embodying the invention; and FIG. 2 illustrates waveforms associated with the circuit of FIG. 1.

In a television receiver power supply and deflection circuit 10 of FIG. 1, a square-wave generator 50 produces a square-wave exciting or input voltage 22 that is applied to the primary winding 23a of a power transformer 23. Square-wave generator 50 comprises a DC source of input voltage $V_i$ developed at a terminal 51 coupled to a center tap terminal of power transformer primary winding 23a, and an inverter 21 which is operated at the horizontal deflection frequency, $1/T_H$, of illustratively 15.75 KHz.

Square-wave exciting voltage 22, when applied to primary winding 23a, develops a horizontal deflection rate alternating polarity voltage across output or secondary windings 23b–23e of power transformer 23. The voltage across secondary winding 23d is rectified by a diode 46 and filtered by a capacitor 47 to produce an auxiliary DC voltage $V_1$ at a terminal 48. The voltage $V_1$ may power such television receiver circuits as the audio and vertical deflection circuits. Secondary or output winding 23c comprises a high voltage winding that is coupled to a high voltage circuit 49 to produce a picture tube ultor accelerating potential at a terminal U.

In a B+ power supply 52, the alternating polarity output voltage developed across output winding 23b is rectified by a diode 26 and filtered by a capacitor 27 to produce a B+ scanning voltage at a terminal 28. The B+ scanning voltage is applied through an input choke 29 to energize a horizontal deflection generator 30. Horizontal deflection generator 30 comprises a conventional horizontal oscillator and driver 31, a trace switch 32 comprising a horizontal output transistor 33 and a damper diode 34, and the series arrangement of retrace capacitors 35 and 36 coupled across trace switch 32. Also coupled across trace switch 32 is the series arrangement of the primary winding of a pulse transformer 37, a horizontal deflection winding 38, a trace capacitor 39, and output winding 23e of power transformer 23.

Trace capacitor 39 functions as a source of trace voltage $v_t$ that is applied by trace switch 32 to horizontal deflection winding 38 during the trace interval of each horizontal deflection cycle to produce a scanning current $i_y$ in horizontal deflection winding 38. The trace voltage $v_t$ is obtained from the B+ voltage developed by power supply 52 by charging capacitor 39 from the input current $i_0$ flowing from choke 29 to a terminal 40 at the junction of choke 29 and the collector of horizontal output transistor 33.

To initiate the horizontal retrace interval of each deflection cycle, horizontal oscillator and driver 31 applies a deflection rate switching signal 41, illustrated schematically in FIG. 1 and in FIG. 2d, to the base of horizontal output transistor 33. As illustrated in FIG. 2d, at time $t_6$, somewhat prior to the initiation of the horizontal retrace interval at time $t_7$, square-wave switching signal 41 switches to the lower signal level, thereby applying a reverse bias voltage to the base of horizontal output transistor 33. Due to the effects of turn-off delay, collector current in horizontal output transistor 33 does not become cut off until time $t_7$ or time $t_1$.

At time $t_1$, with horizontal output transistor 33 being cut off, horizontal deflection winding 38 and retrace capacitors 35 and 36 form a resonant retrace circuit. The horizontal deflection current $i_y$ undergoes a one-half cycle of resonant oscillation during the horizontal retrace interval $t_1$–$t_3$, as illustrated in FIG. 2b, and a retrace pulse voltage $V_r$ is developed at terminal 40, as illustrated in FIG. 2a.

Near time $t_3$, damper diode 34 becomes conductive, ending the horizontal retrace interval and initiating the horizontal trace interval, which occurs between times $t_3$–$t_7$. During the horizontal trace interval, the horizontal deflection current $i_y$, illustrated in FIG. 2b as the solid-line waveform 53 between times $t_3$–$t_7$, first flows in damper diode 34 during the first portion of the trace interval and then flows in horizontal output transistor 33 during the second portion of the trace interval. To enable horizontal deflection current to flow in horizontal output transistor 33, square-wave switching signal 41 forward biases the transistor beginning at time $t_4$, somewhat prior to the center of horizontal trace, time $t_5$.

To synchronize horizontal scanning with the picture content of the television receiver video signal, a retrace pulse signal 42 developed at the junction of retrace capacitors 35 and 36 and a horizontal synchronizing pulse signal 45 developed at a terminal H are applied to the phase comparator, not illustrated, of horizontal oscillator and driver 31. The phase comparator of horizontal oscillator and driver 31 adjusts the phase of the deflection rate switching signal 41 so as to maintain the horizontal retrace interval centered within the blanking interval, thereby providing the required picture synchronization.

During the horizontal trace interval, with trace switch 32 conductive, the trace voltage $v_t$ and the deflection rate alternating polarity voltage $v_{23e}$ developed across power transformer output winding 23e are applied in series across horizontal deflection winding 38 to produce the positive-going sawtooth scanning current waveform 53 between times $t_3$–$t_7$ of FIG. 2b. Deflection rate alternating polarity voltage $v_{23e}$, when properly phased relative to the horizontal scanning current $i_y$, applies to deflection winding 38 the correct voltage waveform needed to provide linearity correction to the horizontal scanning current.

Assume, for example, that the voltage $v_{23e}$ were absent; that is to say, the terminal of trace capacitor 39 remote from deflection winding 38 is directly connected to ground. During the trace interval, only the trace voltage $v_t$ is applied across deflection winding 38. Due to dissipative losses occurring each deflection cycle in horizontal deflection winding 38 and in the elements of horizontal deflection winding 38 and in the elements of horizontal deflection generator 30 such as in trace switch 32, the horizontal scanning waveform $i_y$ departs from the ideal, substantially symmetrical, solid-line waveform 53 of FIG. 2b to the asymmetrical dashed-line waveform 54. The linearity distorted waveform 54 is of shallower slope than the ideal during the latter portion of the trace interval, prior to time $t_7$, resulting in the display of a distorted raster wherein the last-scanned portion of each raster line appears compressed relative to the first-scanned portion.

To correct for linearity distortion, power transformer output winding 23e applies to deflection winding 38 the deflection rate alternating polarity voltage $v_{23e}$, illustrated in FIG. 2c, in series with the trace voltage $v_t$ applied by trace capacitor 39. The phasing of the voltage $V_{23e}$ is such that the sum of the trace voltage $v_t$ and the voltage $V_{23e}$ is greater in magnitude during the latter portion of the trace interval than during the former portion of the trace interval.

As illustrated in FIG. 2c, the alternating polarity voltage $V_{23e}$ is positive between times $t_5$–$t_8$, the time $t_8$ and the time $t_2$ being the center of horizontal retrace, and is negative between times $t_2$–$t_5$. With the voltage applied across deflection winding 38 during the latter portion of trace between times $t_5$–$t_7$ being greater in magnitude than the voltage applied during the former portion of trace between times $t_3$–$t_5$, the slope of the horizontal deflection current $i_y$ is made to steepen during the latter portion of trace to result in substantially the ideal waveform 53 of FIG. 2b, as required to provide a linearity corrected scanning current.

Output winding 23e of power transformer 23 may be tightly coupled magnetically to primary winding 23a with only a relatively small magnitude leakage inductance existing between the two windings. The waveshape of the deflection rate alternating polarity voltage $v_{23e}$ therefore closely follows the waveshape of the square-wave exciting voltage 22. As illustrated in FIG. 2c, the voltage $v_{23e}$ is generally a square-wave voltage with only a relatively small amplitude positive retrace pulse voltage 55 superimposed on the square-wave voltage during the retrace interval $t_1$–$t_3$. The retrace voltage 55 is developed due to retrace deflection current flowing in output winding 23e developing a pulse voltage across the leakage inductance associated with the winding.

To properly phase the substantially square-wave output voltage $v_{23e}$ relative to the phasing of the scanning current 53 to obtain linearity correction, the zero-crossover instant of the voltage $v_{23e}$ is made to occur near or around the zero-crossover instant of the scanning current during trace, near time $t_5$ of FIGS. 2b and 2c. To provide the correct phasing information, the zero-crossover instants of the horizontal scanning current are detected by pulse transformer 37 in the form of a pulse voltage waveform 43 developed across the secondary winding of the pulse transformer. The pulse voltage 43 is applied to inverter 21 to adjust the phase of exciting voltage 22 and thus to adjust the phase of output voltage $v_{23e}$ so that the positive-going transition of the voltage $v_{23e}$ occurs near the center of trace at time $t_5$, as illustrated in FIGS. 2b, 2c and 2f, with FIG. 2f illustrating the pulse voltage 43.

Pulse transformer 37 may be designed as a saturable, toroidal core transformer. Deflection current flowing through the primary winding of the transformer maintains the core in magnetic saturation during substantially the entire horizontal deflection cycle except near the zero-crossover instants $t_2$ and $t_5$ of the horizontal deflection current $i_y$ of FIG. 2b. When the core is magnetically saturated, no output voltage is developed across the secondary winding of pulse transformer 37. Near the zero-crossover instants of the deflection current, the core of transformer 37 comes out of saturation, producing a pulse voltage 43a near the center of horizontal trace, near time $t_5$ of FIG. 2f, and producing a pulse voltage 43b near the center of horizontal retrace, near time $t_2$. By applying pulse voltage 43 to inverter 21, the correct phasing of square-wave output voltage $v_{23e}$ relative to the phasing of the horizontal scanning current may be provided to obtain linearity correction, as previously explained. The design and construction of pulse transformer 37 and the phasing of inverter 21 thereby is described in the U.S. Patent Application of D. W. Luz and D. H. Willis, Ser. No. 174,943, filed Aug. 4, 1980, entitled "Television Receiver, Push-Pull Inverter, Ferroresonant Transformer Power Supply Synchronized With Horizontal Deflection", hereby incorporated by reference.

Alternatively, inverter 21 may be conventionally designed, and the appropriate phasing information of exciting voltage 22 and output voltage $v_{23e}$ relative to horizontal scanning may be obtained from horizontal oscillator and driver 31. Horizontal oscillator and driver 31 applies to the inverter a phase-shifted square-wave voltage 44, illustrated in FIG. 2e, that is developed at a terminal S. Square-wave voltage 44 synchronizes operation of the inverter such that output voltage $v_{23e}$ is developed in-phase with the square-wave voltage 44, as illustrated in FIGS. 2c and 2e. By phase shifting square-wave voltage 44 relative to the square-wave switching voltage 41 by an amount $\Delta t = t_5 - t_4$, the positive-going transition of square-wave voltage 44 is shifted from the instant $t_4$ to the instant $t_5$, as required to provide the proper phasing of voltage $v_{23e}$ for linearity correction.

Power flows into horizontal deflection generator 30 and horizontal deflection winding 38 each deflection cycle to replenish the dissipative losses sustained therein. One source of power flowing into horizontal deflection generator 30 is output winding 23b of power supply 52.

Another power source to replenish losses in horizontal deflection winding 38 and horizontal deflection generator 30 is the linearity correction output winding 23e. Winding 23e serves as a source of alternating polarity voltage that is substantially in-phase with the deflection current $i_y$ flowing in this source. Thus, during the interval $t_5$–$t_7$, positive deflection current flows out of the terminal of winding 23e remote from the grounded terminal while that remote terminal is at a positive voltage with respect to ground, thereby producing a net power flow out of winding 23e to horizontal deflection winding 38. Similarly, during the interval $t_2$–$t_5$, negative deflection current flows into the remote terminal while that terminal is at a negative voltage with respect to ground, again resulting in a net power flow out of the winding into horizontal deflection winding 38.

With linearity correction output winding 23e serving as an additional power source to replenish losses in horizontal deflection winding 38 and horizontal deflection generator 30, less power is required to flow from output winding 23b and power supply 52, permitting lower rated components to be used in the power supply. Furthermore, any additional circuitry coupled between B+ terminal 28 and deflection generator terminal 40, such as may be used to provide side pincushion correction to the horizontal scanning current, encounters reduced stresses because of the reduced power flow required of power supply 52. Typically, winding 23e may provide about 50% or more of the power requirements of horizontal deflection winding 38 and horizontal deflection generator 30.

Square-wave voltage $v_{23e}$ is illustrated in FIG. 2c as being a 50% duty cycle, alternating polarity voltage. Other percentage duty cycle output voltages may be used as long as the output voltages are properly phased to result in a positive voltage $v_{23e}$ during substantially all of the latter portion of the trace interval and a negative voltage during substantially all of the former portion of the trace interval. It is relatively undesirable for the output voltage $v_{23e}$ to become negative for a substantial interval immediately prior to the end of trace because additional raster distortion near the end of scan may be produced.

FIG. 2c illustrates the positive-going transition of the linearity correction voltage waveform $v_{23e}$ as occurring at the center of trace, at time $t_5$. This transition may be made to occur somewhat earlier than time $t_5$ or somewhat later than time $t_5$ while still providing acceptable linearity correction. For example, assuming a horizontal trace interval of around 51 microseconds, a positive-going transition occurring within an interval of $\pm 6$ microseconds centered around time $t_5$ will provide satisfactory linearity correction to the horizontal scanning current $i_y$.

Power transformer 23 may be constructed as a conventional switching power transformer with all of the output windings 23b–23e being tightly coupled to the primary winding 23a. Alternatively, power transformer 23 may be constructed as a ferroresonant power transformer with the supply voltage windings 23b–23d wound around a portion of the transformer core 123 that magnetically saturates during each half cycle of the exciting voltage 22 to provide regulated output voltages across each of the windings 23b–23d. To provide a circulating current that generates a magnetic flux that aids in saturating the core portion under windings 23b–23d, a capacitor 24 may be coupled across winding 23b or a capacitor 25 may be coupled across winding 23c. The design and construction of a ferroresonant power transformer 23, including one with a high voltage winding 23c, may be similar to that described in the U.S. Patent Application of F. S. Wendt, Ser. No. 144,150, filed Apr. 28, 1980, a continuation of Ser. No. 007,815, filed Jan. 30, 1979, now abandoned, both applications being entitled "High Frequency Ferroresonant Power Supply for a Deflection and High Voltage Circuit", hereby incorporated by reference.

When using a ferroresonant power transformer 23, the regulated output windings such as windings 23b–23d are loosely coupled magnetically with primary winding 23a. The waveform of the voltages across these output windings may be somewhat sinusoidal or may not have relatively sharply sloped positive and negative-going transitions. To provide sharply sloped transitions to the the output voltage developed across linearity correction output winding 23e, the output winding 23e may be tightly coupled magnetically with the primary winding 23a rather than being tightly coupled with any one of the other output windings 23b–23d.

If the DC input voltage $V_i$ is unregulated in amplitude, as may be the case when using a ferroresonant power transformer to provide regulated voltages across output windings 23b–23d, the amplitude of the square-wave voltage $v_{23e}$ will vary with amplitude variations in the input voltage $V_i$. Typically, the input voltage $V_i$ may vary about $+10\%$ around its nominal value, producing a variation in the amplitude of the voltage $v_{23e}$ of around $+10\%$. Such an amplitude variation of the voltage $v_{23e}$ will result in an even smaller variation in the linearity correction provided, substantially less than a 5% variation, for example. Such a small variation in linearity correction will have little deleterious effect on the observed raster.

Using the linearity correction arrangement of FIG. 1, embodying the invention, linearity correction is readily obtained for wide angle deflection systems which may have a relatively poor deflection winding L/R ratio of, for example, 0.6 millihenry per ohm. Such wide angle deflection systems may require 10 to 15 percent linearity correction to the horizontal deflection current. Conventional techniques for linearity correction, such as connecting a variable impedance in series with the deflection winding, either have relative difficulty in providing the required amount of linearity correction or require the use of relatively expensive components such as saturable reactors. Saturable reactors use permanent magnets to control the magnetic bias of the core. Adjustable magnets are sometimes required to properly set the bias point. The linearity correction arrangement of FIG. 1 gives a predictable amount of correction requiring no adjustment procedure. Furthermore, saturable reactor linearity coils obtain linearity correction by varying the inductance of the reactor as a function of the deflection current flowing through the reactor winding and thus do not advantageously function as an additional source of power input.

What is claimed is:

1. A deflection circuit with linearity correction, comprising:
    a source of voltage that includes a deflection rate alternating polarity voltage, said source capable of delivering power during the beginning and ending portions of the trace interval of each deflection cycle;
    a deflection winding;
    a deflection generator including a source of trace voltage and a trace switch coupled to said deflection winding and responsive to a deflection rate switching signal for applying said trace voltage in series with said deflection rate voltage across said deflection winding during each deflection cycle to generate scanning current in said deflection winding; and
    means coupled to said source of deflection rate alternating polarity voltage for phasing said deflection rate alternating polarity voltage relative to said scanning current so as to deliver power from said alternating polarity voltage source during significant periods within said beginning said ending portions in a manner providing substantial linearity correction to said scanning current.

2. A circuit according to claim 1 wherein the phasing of said deflection rate alternating polarity voltage is such that the sum of the trace voltage and deflection rate alternating polarity voltage is greater in magnitude during substantially all of the later scanned portion of the trace interval of each deflection cycle than during substantially all of the earlier scanned portion of the trace interval.

3. A circuit according to claim 2 wherein power flow from said source of deflection rate alternating polarity voltage to said deflection winding during substantially all of the trace interval of each deflection cycle to replace power losses sustained in said deflection winding and said deflection generator.

4. A circuit according to claim 1 wherein said phasing means phases said deflection rate alternating polarity voltage so that a zero-crossover instant of said deflection rate alternating polarity voltage occurs around the zero-crossover instant of said scanning current during the trace interval of each deflection cycle.

5. A circuit according to claim 4 wherein said phasing means comprises a pulse transformer with a primary winding in the series path of said scanning current and a secondary winding coupled to said source of deflection rate alternating polarity voltage, a pulse voltage being developed across said pulse transformer secondary winding near said zero-crossover instant of said scanning current and being applied to said source of deflection rate alternating polarity voltage for providing said phasing.

6. A circuit according to claim 4 wherein said phasing means comprises an oscillator and driver that applies said deflection rate switching signal to said trace switch and that applies a signal to said source of deflection rate alternating polarity voltage that is phase-shifted with respect to said deflection rate switching signal so as to provide said linearity correction.

7. A deflection circuit with linearity correction, comprising:
    a source of deflection rate alternating polarity voltage;
    a deflection winding;
    a deflection generator including a source of trace voltage and a trace switch coupled to said deflection winding and responsive to a deflection rate switching signal for applying said trace voltage in series with said deflection rate voltage across said deflection winding each deflection cycle to generate scanning current in said deflection winding; and
    means coupled to said source of deflection rate alternating polarity voltage for phasing said deflection rate alternating polarity voltage relative to said scanning current in a manner providing linearity correction to said scanning current,
    wherein said source of deflection rate alternating polarity voltage comprises a square-wave generator and a power transformer, said square-wave generator developing a square-wave exciting voltage that is applied to the primary winding of said power transformer, a second winding of said power transformer having developed thereacross said deflection rate alternating polarity voltage and being series coupled with said source of trace voltage and deflection winding across said trace switch.

8. A circuit according to claim 7 including a B+ power supply coupled to an output winding of said power transformer and to said deflection generator for developing said source of trace voltage from the voltage developed across said output winding.

9. A circuit according to claim 8 wherein said power transformer comprises a ferroresonant power transformer for regulating the voltage developed across said output winding against variations of said exciting voltage.

10. A circuit according to claim 9 wherein said second winding of said ferroresonant power transformer is relatively tightly coupled magnetically to said primary winding of said ferroresonant power transformer and said output winding is relatively loosely coupled to said primary winding.

11. A circuit according to claim 10 including a high voltage circuit coupled to another output winding of said ferroresonant power transformer for developing an ultor accelerating potential from the regulated voltage developed across said other output winding.

12. A power supply and linearity corrected deflection circuit, comprising:
 a DC source of input voltage;
 an inverter coupled to said DC source and operated at the horizontal deflection frequency for developing a square-wave supply voltage repeating at said horizontal deflection frequency;
 a power transformer having a first winding excited by said square-wave supply voltage for developing a horizontal deflection frequency alternating polarity output voltage across second and third windings of said power transformer;
 a horizontal deflection winding;
 a horizontal deflection generator coupled to said power transformer second winding and energized thereby to develop a trace voltage across a trace capacitance, said deflection generator including a trace switch coupled across the series arrangement of said deflection winding, trace capacitance and power transformer third winding and responsive to a horizontal deflection frequency switching signal for generating horizontal deflection current in said deflection winding; and
 means for phasing said alternating polarity output voltage relative to the phasing of said horizontal deflection current so as to obtain linearity correction of said deflection current.

13. A circuit according to claim 12 wherein said phasing means phases said alternating polarity output voltage so as to increase the magnitude of the voltage applied across said deflection winding during a later portion of the trace interval of a horizontal deflection cycle over that applied during an earlier portion.

14. A circuit according to claim 13 wherein said horizontal deflection current flows into said power transformer third winding and wherein a net power flows into said horizontal deflection generator each deflection cycle from both said power transformer second and third windings.

15. A circuit according to claim 14 wherein said phasing means comprises a pulse transformer having said horizontal deflection current flowing in the pulse transformer primary winding and having a pulse transformer secondary winding coupled to said inverter, a phasing pulse being applied by said pulse transformer secondary winding to said inverter during each zero-crossover of said horizontal deflection current.

16. A circuit according to claim 14 wherein said phasing means comprises a horizontal oscillator and driver which develops said horizontal deflection frequency switching signal for said trace switch and which develops a horizontal deflection frequency phasing signal that is applied to said inverter for phase shifting the power transformer square-wave supply voltage relative to the horizontal deflection frequency switching signal so as to obtain said linearity correction.

17. A circuit according to claims 12, 13, 14, 15 or 16 wherein said power transformer comprises a ferroresonant transformer for regulating the voltage developed across said ferroresonant transformer second winding against variations of said input voltage.

18. A circuit according to claim 17 wherein said first and third windings are relatively tightly coupled magnetically and said first and second windings are relatively loosely coupled.

19. A circuit according to claim 18 including a fourth winding of said ferroresonant transformer developing a regulated high voltage and means coupled to said fourth winding for developing an ultor accelerating potential from said regulated high voltage.

* * * * *

UNITED STATES PATENT AND TRADEMARK OFFICE
CERTIFICATE OF CORRECTION

PATENT NO. : 4,321,511
DATED : March 23, 1982
INVENTOR(S) : DONALD H. WILLIS

It is certified that error appears in the above-identified patent and that said Letters Patent is hereby corrected as shown below:

IN THE ABSTRACT, line 9, "race" should be --trace--.

Column 4, line 1, delete entire line

Column 6, line 28 "+6" should be -- $\pm 6$ --.

Column 7, line 5, "+10%" should be -- $\pm 10\%$ --.

Column 7, line 7, "+10%" should be -- $\pm 10\%$ --.

Column 7, line 58 (CLAIM 1, line 22), "said" (second occurrence) should be -- and --.

Column 7, line 61 (CLAIM 2, line 1), "claim 1" should be -- claims 1 or 7 --.

Column 8, line 1 (CLAIM 3, line 1), "flow" should be -- flows --.

Column 8, line 7 (CLAIM 4, line 1), "claim 1" should be -- claims 1 or 7 --.

Signed and Sealed this

Seventh Day of September 1982

[SEAL]

Attest:

GERALD J. MOSSINGHOFF

Attesting Officer   Commissioner of Patents and Trademarks